(12) United States Patent
Sherman

(10) Patent No.: US 8,946,608 B2
(45) Date of Patent: Feb. 3, 2015

(54) SOLAR TRACKING SYSTEM

(71) Applicant: Suncore Photovoltaics, Inc., Irwindale, CA (US)

(72) Inventor: James Sherman, Hillsborough, NJ (US)

(73) Assignee: Suncore Photovoltaics, Inc., Albuquerque, NM (US)

( * ) Notice: Subject to any disclaimer, the term of this patent is extended or adjusted under 35 U.S.C. 154(b) by 0 days.

(21) Appl. No.: 13/970,235

(22) Filed: Aug. 19, 2013

(65) Prior Publication Data
US 2013/0333745 A1 Dec. 19, 2013

Related U.S. Application Data

(63) Continuation of application No. 12/498,135, filed on Jul. 6, 2009, now Pat. No. 8,513,514, which is a continuation-in-part of application No. 12/258,253, filed on Oct. 24, 2008, now Pat. No. 7,795,568.

(51) Int. Cl.
*H01L 31/042* (2014.01)
*H01L 31/052* (2014.01)
(Continued)

(52) U.S. Cl.
CPC .................. *H01L 31/052* (2013.01); *F24J 2/38* (2013.01); *F24J 2/4607* (2013.01); *F24J 2/542* (2013.01);
(Continued)

(58) Field of Classification Search
USPC ................ 250/203.4; 126/572, 573, 576, 577
See application file for complete search history.

(56) References Cited

U.S. PATENT DOCUMENTS 3,966,499 A 6/1976 Yasui et al.
4,001,864 A 1/1977 Gibbons
(Continued)

FOREIGN PATENT DOCUMENTS

AU 2087695 10/1995
CN 2882108 Y 3/2007
(Continued)

OTHER PUBLICATIONS

"170 Watt Multi-Purpose Module NEC 2008 Compliant, NE-170UC1" datasheet. Sharp Electronics Corporation, Huntington, CA, 2008; 2 pgs.
(Continued)

*Primary Examiner* — Tony Ko
(74) *Attorney, Agent, or Firm* — Mueting, Raasch & Gebhardt, P.A.

(57) ABSTRACT

An automated method causes a terrestrial solar cell array to track the sun. The solar cell system includes motors that adjust a position of the array along different respective axes with respect to the sun, wherein a first motor adjusts the inclination angle of the array relative to the surface of the earth and a second motor rotates the array about an axis substantially perpendicular to that surface. The method includes (a) using a software algorithm to predict a position of the sun at a future time; (b) using a computer model to determine respective positions for the motors corresponding to the solar cell array being substantially aligned with the sun at the future time; and (c) activating and operating the motors at respective particular speeds so that at the future time the solar cell array is substantially aligned with the sun. The future time may correspond to any time during operation. An initial future time may correspond to a start up time after sunrise at which point the solar cell is to begin tracking the sun.

19 Claims, 10 Drawing Sheets

(51) Int. Cl.
*F24J 2/38* (2014.01)
*F24J 2/46* (2006.01)
*F24J 2/54* (2006.01)
*F24J 2/52* (2006.01)

(52) U.S. Cl.
CPC ........ *H01L 31/0422* (2013.01); *H01L 31/0522* (2013.01); *F24J 2/523* (2013.01); *F24J 2200/04* (2013.01); *Y02E 10/47* (2013.01); *Y02E 10/52* (2013.01)
USPC ........................................ 250/203.4; 136/246

(56) References Cited

U.S. PATENT DOCUMENTS

| | | |
|---|---|---|
| 4,031,385 A | 6/1977 | Zerlaut et al. |
| 4,109,640 A | 8/1978 | Smith |
| 4,172,739 A | 10/1979 | Tassen |
| 4,187,123 A | 2/1980 | Diggs |
| 4,249,514 A | 2/1981 | Jones |
| 4,338,480 A | 7/1982 | Antypas et al. |
| 4,345,582 A | 8/1982 | Aharon |
| 4,385,198 A | 5/1983 | Rahilly |
| 4,425,904 A | 1/1984 | Butler |
| 4,491,681 A | 1/1985 | Kirpich |
| 4,574,659 A | 3/1986 | Arndt |
| 4,585,318 A | 4/1986 | Seifert |
| 4,759,803 A | 7/1988 | Cohen |
| 4,832,001 A | 5/1989 | Baer |
| 4,868,379 A | 9/1989 | West |
| 4,933,022 A | 6/1990 | Swanson |
| 4,989,124 A | 1/1991 | Shappell |
| 4,995,377 A | 2/1991 | Eiden |
| 5,009,720 A | 4/1991 | Hokuyo et al. |
| 5,019,177 A | 5/1991 | Wanlass |
| 5,022,929 A | 6/1991 | Gallois-Montbrun |
| 5,053,083 A | 10/1991 | Sinton |
| 5,118,361 A | 6/1992 | Fraas et al. |
| 5,169,456 A | 12/1992 | Johnson |
| 5,217,539 A | 6/1993 | Fraas et al. |
| 5,228,924 A | 7/1993 | Barker et al. |
| 5,248,346 A | 9/1993 | Fraas et al. |
| 5,317,145 A | 5/1994 | Corio |
| 5,322,572 A | 6/1994 | Wanlass |
| 5,330,583 A | 7/1994 | Asai et al. |
| 5,342,453 A | 8/1994 | Olson |
| 5,376,185 A | 12/1994 | Wanlass |
| 5,389,158 A | 2/1995 | Fraas et al. |
| 5,389,159 A | 2/1995 | Kataoka et al. |
| 5,405,453 A | 4/1995 | Ho et al. |
| 5,600,124 A | 2/1997 | Berger |
| 5,616,185 A | 4/1997 | Kukulka |
| 5,622,078 A | 4/1997 | Mattson |
| 5,632,823 A | 5/1997 | Sharan |
| 5,798,517 A | 8/1998 | Berger |
| 5,944,913 A | 8/1999 | Hou et al. |
| 6,051,776 A | 4/2000 | Kimata et al. |
| 6,058,930 A | 5/2000 | Shingleton |
| 6,080,927 A | 6/2000 | Johnson |
| 6,103,970 A | 8/2000 | Kilmer et al. |
| 6,123,067 A | 9/2000 | Warrick |
| 6,239,354 B1 | 5/2001 | Wanlass |
| 6,252,287 B1 | 6/2001 | Kurtz et al. |
| 6,278,054 B1 | 8/2001 | Ho et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,316,716 B1 | 11/2001 | Hilgrath |
| 6,326,540 B1 | 12/2001 | Kilmer et al. |
| 6,340,788 B1 | 1/2002 | King et al. |
| 6,359,210 B2 | 3/2002 | Ho et al. |
| 6,372,980 B1 | 4/2002 | Freundlich |
| 6,399,874 B1 | 6/2002 | Olah |
| 6,452,086 B1 | 9/2002 | Muller |
| 6,465,725 B1 | 10/2002 | Shibata et al. |
| 6,482,672 B1 | 11/2002 | Hoffman et al. |
| 6,483,093 B1 | 11/2002 | Takemura et al. |
| 6,552,257 B1 | 4/2003 | Hart et al. |
| 6,563,040 B2 | 5/2003 | Hayden et al. |
| 6,600,100 B2 | 7/2003 | Ho et al. |
| 6,660,928 B1 | 12/2003 | Patton et al. |
| 6,680,432 B2 | 1/2004 | Sharps et al. |
| 6,696,637 B2 | 2/2004 | Lawheed |
| 6,951,819 B2 | 10/2005 | Iles et al. |
| 6,960,717 B2 * | 11/2005 | Stuart et al. .................. 136/246 |
| 7,071,407 B2 | 7/2006 | Fatemi et al. |
| 7,109,461 B2 | 9/2006 | Lasich |
| 7,252,084 B2 | 8/2007 | Pawlenko et al. |
| 7,381,886 B1 | 6/2008 | Aiken et al. |
| 7,476,832 B2 | 1/2009 | Vendig et al. |
| 7,795,568 B2 | 9/2010 | Sherman |
| 8,188,415 B2 | 5/2012 | Kats et al. |
| 8,193,477 B2 * | 6/2012 | Sherman et al. ........... 250/203.4 |
| 8,466,399 B1 | 6/2013 | Sherman |
| 8,578,929 B2 | 11/2013 | Krabbe et al. |
| 8,592,738 B1 | 11/2013 | Kozin et al. |
| 2002/0040727 A1 | 4/2002 | Stan et al. |
| 2002/0164834 A1 | 11/2002 | Boutros et al. |
| 2003/0000564 A1 | 1/2003 | Shingleton et al. |
| 2003/0066555 A1 | 4/2003 | Hui et al. |
| 2003/0070707 A1 | 4/2003 | King et al. |
| 2003/0075215 A1 | 4/2003 | Sharps et al. |
| 2003/0140962 A1 | 7/2003 | Sharps et al. |
| 2003/0145884 A1 | 8/2003 | King et al. |
| 2004/0031517 A1 | 2/2004 | Bareis |
| 2004/0045598 A1 | 3/2004 | Narayanan et al. |
| 2004/0112373 A1 | 6/2004 | Djeu |
| 2004/0112424 A1 | 6/2004 | Araki et al. |
| 2004/0149331 A1 | 8/2004 | Sharps et al. |
| 2005/0121071 A1 | 6/2005 | Repetto et al. |
| 2005/0274409 A1 | 12/2005 | Fetzer |
| 2005/0284467 A1 | 12/2005 | Patterson |
| 2006/0054162 A1 | 3/2006 | Romeo |
| 2006/0144435 A1 | 7/2006 | Wanlass |
| 2006/0162768 A1 | 7/2006 | Wanlass |
| 2007/0079863 A1 | 4/2007 | Stan et al. |
| 2007/0089777 A1 | 4/2007 | Johnson, Jr. et al. |
| 2007/0101738 A1 | 5/2007 | Akei et al. |
| 2007/0188876 A1 | 8/2007 | Hines et al. |
| 2007/0193620 A1 | 8/2007 | Hines et al. |
| 2007/0215199 A1 | 9/2007 | Dold et al. |
| 2007/0246095 A1 | 10/2007 | Schaefer |
| 2008/0041440 A1 | 2/2008 | O'Connell et al. |
| 2008/0128586 A1 | 6/2008 | Johnson et al. |
| 2008/0135087 A1 | 6/2008 | Anikara |
| 2008/0178867 A1 | 7/2008 | DiDomenico |
| 2008/0258051 A1 | 10/2008 | Heredia et al. |
| 2008/0290252 A1 | 11/2008 | Leonhardt et al. |
| 2009/0000662 A1 | 1/2009 | Harwood et al. |
| 2009/0032014 A1 * | 2/2009 | Meydbray .................... 126/608 |
| 2009/0032084 A1 | 2/2009 | Aiken et al. |
| 2009/0032086 A1 * | 2/2009 | Kats et al. .................... 136/246 |
| 2009/0126774 A1 | 5/2009 | Taylor et al. |
| 2009/0179139 A1 | 7/2009 | Hines et al. |
| 2009/0188488 A1 | 7/2009 | Kraft et al. |
| 2010/0011565 A1 | 1/2010 | Zawadzki et al. |
| 2010/0018519 A1 * | 1/2010 | McDonald et al. ........... 126/573 |
| 2010/0018570 A1 | 1/2010 | Cashion et al. |
| 2010/0023138 A1 | 1/2010 | McDonald et al. |
| 2010/0032004 A1 | 2/2010 | Baker et al. |
| 2010/0101625 A1 | 4/2010 | Kats et al. |
| 2010/0101630 A1 | 4/2010 | Kats et al. |
| 2010/0101632 A1 | 4/2010 | Kats et al. |
| 2010/0102200 A1 | 4/2010 | Kats et al. |
| 2010/0102201 A1 | 4/2010 | Sherman |
| 2010/0102202 A1 | 4/2010 | Sherman |
| 2010/0108860 A1 | 5/2010 | Sherman et al. |
| 2010/0175741 A1 | 7/2010 | Thorne |

(56) References Cited

U.S. PATENT DOCUMENTS

| | | |
|---|---|---|
| 2010/0294337 A1 | 11/2010 | Sherman et al. |
| 2011/0289750 A1 | 12/2011 | Kats et al. |
| 2013/0306836 A1 | 11/2013 | Sherman et al. |

FOREIGN PATENT DOCUMENTS

| | | |
|---|---|---|
| CN | 1949525 A | 4/2007 |
| DE | 30 05 876 | 9/1981 |
| DE | 3236506 | 3/1984 |
| DE | 103 43 374 | 12/2004 |
| DE | 20 2005 002 411 | 5/2005 |
| DE | 10 2005 055 258 | 5/2007 |
| EP | 0024057 | 2/1981 |
| EP | 0369666 | 7/1989 |
| EP | 0464738 | 1/1992 |
| EP | 0537781 | 4/1993 |
| EP | 0789405 | 8/1997 |
| EP | 1126529 | 8/2001 |
| EP | 1691423 | 8/2006 |
| EP | 1788322 | 5/2007 |
| ES | 1044310 | 4/2000 |
| ES | 2253099 | 5/2006 |
| FR | 2566183 | 12/1985 |
| GB | 2128017 | 4/1984 |
| GB | 2346010 | 7/2000 |
| JP | 60-160181 | 8/1985 |
| JP | 9064397 | 3/1997 |
| JP | 10062017 | 3/1998 |
| JP | 2000-196127 | 7/2000 |
| JP | 2000-223730 | 8/2000 |
| JP | 2002-202817 | 7/2002 |
| JP | 2004-153202 | 5/2004 |
| WO | WO 96/18213 | 6/1996 |
| WO | WO 99/62125 | 12/1999 |
| WO | WO 02/079793 | 10/2002 |
| WO | WO 02/080286 | 10/2002 |
| WO | WO 2008/008023 | 1/2008 |
| WO | WO 2009/048879 | 4/2009 |

OTHER PUBLICATIONS

"Combined Search and Examination Report," application No. GB0918669.3. Feb. 17, 2010. Intellectual Property Office, Newport, South Wales, UK.

"Concentrating PV module and system developers[#5]" Photon International: The Photovoltaic Magazine, Photon Europe GmbH, Germany, Aug. 2009; pp. 134-137.

Cotal et al. "Outdoor Operation of GaInP/GaAs/Ge Triple Junction Concentrator Solar Cells Up to 1000 Suns;" 3rd World Conference on Photovoltaic Energy Conversion, May 11-18, 2003 Osaka, Japan; 3 pages.

"FEiNA SF-4 Mini Tracker" datasheet. OPEL Solar™ Inc., www.opelinc.com, Shelton, CT, Nov. 2009; 2 pgs.

"FEiNA SF-9 Dual Axis Tracker" datasheet. OPEL Solar™ Inc., www.opelinc.com, Shelton, CT, Nov. 2009; 2 pgs.

"FEiNA SF-20 Dual Axis Tracker" datasheet. Opel Solar™ Inc., www.opelinc.com, Shelton, CT, Nov. 2009; 2 pgs.

Fraas et al., "Start-Up of First 100 kW System in Shanghai with 3-Sun PV Mirror Modules." Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA. 4 pages.

Fraas et al., "Test Sites and Testing of 3-Sun Mirror Modules." Presented at IEEE 4th World Conference on Photovoltaic Energy Conversion, Waikoloa, Hawaii, May 9, 2006. Jxcrystals.com. JX Crystals, Inc., Issaquah, WA. 4 pages.

Garboushian et al. "A Novel High-Concentration PV Technology for Cost Competitive Utility Bulk Power Generations;" Proc. 1st World Conference on Photovoltaic Energy Conversion, Waikoloa, Hawaii, Dec. 5-9, 1994; 4 pgs.

German Examination Report 10 2007 044 477. 1-33, dated Oct. 24, 2008; 5 pgs.

"GLOBO-welding. Laser welding of plastics—innovative and flexible. The universal processing concept for 3D and continuous applications." Brochure datasheet. http://www.leister.com/uploads/pdf/en/BRO_GLOBO_Welding_dv092006_ENG.pdf. Sep. 2006. Leister Process Technologies. Sarnen, Switzerland. 4 pages.

Hering, "Starthilfe für einen Hoffnungsträger," dated May 2007; pp. 96-103.

"Kinematics slewing drives," Product description datasheet [online]. Kinematics Manufacturing, Inc., Phoenix, AZ, 2009, available online [retrieved on Jul. 8, 2009]. Retrieved from the Internet:<URL: www.kinematicsmfg.com/Products/slewing-drives.aspx>; 1 page.

King et al. "High-efficiency space and terrestrial multijunction solar cells through bandgap control in cell structures." 2002 Photovoltaic Specialists Conference, Conference Record of the 29th IEEE, May 19-24, 2002, pp. 776-781. New Orleans, LA.

"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).

Levy et al., "Photovoltaic Concentrator Module Improvements Study" Contractor Report, Sandia National Laboratories; SAND91-7001 Unlimited Release UC-275 http://www.osti.gov/bridge/serlets/purl/5212150-HmCMF1/5212150.PDF; Aug. 1991; 156 pgs.

Luque et al., Ed. Sections 9.8 and 9.9 "High-Efficiency III-V Multijunction Solar Cells," and Chapter 11 "Photovoltaic Concentrators," Handbook of Photovoltaic Science and Engineering, John Wiley & Sons, Ltd., Hoboken, NJ, Jul. 7, 2003; 64 pgs.

"Mk-ID High Concentration Photovoltaic Panel (HCPV)" datasheet. OPEL Solar™ Inc., www.opelinc.com, Shelton, CT, Nov. 2009; 2 pgs.

Newman et al, "Terrestrial Solar Cell Development at Emcore and Roadmap to achieving Higher Performance," 4th International Conference on Solar Concentrators for the Generation of Electricity or Hydrogen, Mar. 12-16, 2007, San Lorenzo de El Escorial, Spain, 4 pgs.

Office Action, State Intellectual Property Office, China, application No. 200710163494.5. With attached English translation. May 4, 2010; 9 pgs.

Office Action mailed Mar. 29, 2011. U.S. Appl. No. 12/200,168.

"OPEL SF-4M Roof Top Tracker" datasheet. OPEL Solar™ Inc., www.opelinc.com, Shelton, CT, Nov. 2009; 2 pgs.

"OPEL Sf-20 CPV Dual Axis Tracker" datasheet. Opel Solar™ Inc., www.opelinc.com, Shelton, CT, Nov. 2009; 2 pgs.

"OPEL TF-800 Single Axis Tracker" datasheet. OPEL Solar™ Inc., www.opelinc.com, Shelton, CT, Nov. 2009; 2 pgs.

Peters et al., "Manufacturing Injection-Molded Fresnel Lens Parquets for Point-Focus Concentrating Photovoltaic Systems" Contractor Report, Sandia National Laboratories; SAND95-1554 Unlimited Release UC-1272 http://www.osti.gov/bridge/servlets/purl/120927-64DDlo/webviewable/120927.Pdf; Oct. 1995; 34 pgs.

Photograph of GE Concentrator Array, Circa 1983, Sandia; 1 page.

"Power-Spar PS-140 Solar Concentrator," datasheet. Menova Energy, Inc., Markham, Ontario, Canada, 2009 (metadata indicates that the datasheet was created Jan. 19, 2009); 2 pgs.

"SF-40 H1 Rooftop Tracker" datasheet. OPEL Solar™ Inc., www.opelinc.com, Shelton, CT, Nov. 2009; 2 pgs.

Sherif et al., "First demonstration of multi junction receivers in a grid-connected concentrator module," Conference Record of the Thirty-First IEEE Photovoltaic Specialist Conference, Lake Buena Vista, FL, Jan. 3-7, 2005; pp. 635-638.

Slade et al. "High Efficiency Solar Cells for Concentrator Systems: Silicon or Multi-Junction?" SPIE Optics and Photonics, San Diego, CA, Aug. 2005; 8 pgs.

"Shop SABRE, a N.A.S.C.I. Company, 'The Way CNC Was Meant to Be'" Laser Product Information datasheet. Shop SABRE, Elko, MN, USA, 2007, available online [earliest known availability: Jun. 13, 2007; retrieved on Jun. 26, 2008]. Retrieved from the Internet:<URL:http://www.shopsabre.com/Laser%20Page.html>; 4 pgs.

"Slewing Drives 57b-73m-32ra," datasheet [online]. Kinematics Manufacturing, Inc., Phoenix, AZ, 2009, available online [earliest known availability: Mar. 8, 2009; retrieved on Jul. 8, 2009]. Retrieved

(56) References Cited

OTHER PUBLICATIONS from the Internet:<URL:www.kinematicsmfg.com/Products/slewing-drives/SlewingDrivesProducts/Slewing-Drives-S7B-73M-32RA.aspx>; 2 pgs.

"State of the Art Report," Spanish application No. 200703074. Spanish Patent and Trademark Office, Madrid, Spain. May 19, 2010. 6 pgs.

Stone et al., "Design & Performance of the Amonix High Concentration Solar PV System," ASES/ASME National Solar Energy Conference, Reno, NV, Jun. 15-20, 2002, 7 pgs.

Stone et al., "Operation of 350 kW of Amonix High Concentration PV Systems at Arizona Public Service," ASME 2003 International Solar Energy Conference, Kohala Coast, Hawaii, Mar. 15-18, 2003, 6 pgs.

Stone et al. "Analysis of Five Years of Field Performance of the Amonix High Concentration PV System." Powergen 2006, Las Vegas, NV, Apr. 2006, 12 pgs.

"SunCube™ Specifications" datasheet. Green & Gold Energy Pty, Ltd., Glynde, South Australia, Australia, Sep. 3, 2009; 4 pgs.

"Sunflower" datasheet. Energy Innovations, Poway, CA, copyright 2003-2010; 2 pgs.

Takamoto et al., "InGaP/GaAs-based multijunction solar cells," Prog Photovoltaics Res Appl; Sep. 2005; 13(6):495-511.

"TF-500 Dual Axis Tracker" datasheet. Opel Solar™ Inc., www.opelinc.com, Shelton, CT, Nov. 2009; 2 pgs.

White et al., "Solar Kinetics' Photovoltaic Concentrator Module and Tracker Development" Contractor Report, Sandia National Laboratories; SAND95-2528 Unlimited Release UC-1272. Nov. 1995. http://www.osti.gov/bridge/servlets/purl/159347-62QrpU/webviewable/159347.PDF.

"WS T1000" datasheet [online]. WS Energia Lda, Oeiras, Portugal, earliest known availability Oct. 20, 2010, available online. Retrieved from the Internet<URL: http://www.ws-energia.com/np4EN/trackers>; 2 pgs.

"WS T 1600—the world wide connected solar tracker" datasheet [online] WS Energia Lda, Oeiras, Portugal, earliest known availability Oct. 20, 2010, available online. Retrieved from the Internet:<URL: http://www.ws-energia.com/np4EN/trackers>; 3 pgs.

"WS T 1600—the world wide connected solar tracker" datasheet [online] WS Energia Lda, Oeiras, Portugal, earliest known availability Oct. 20, 2010, available online. Retrieved from the Internet:<URL: http://www.ws-energia.com/np4EN/trackers>; 2 pgs.

Reda and Andreas, "Solar Position Algorithm for Solar Radiation Applications," National Renewable Energy Laboratory, Golden, Colorado, Revised Jan. 2008, Retrieved from the Internet: <http://rrede.nrel.gov/solar/codesandalgorithms/spa/>; 56 pgs.

\* cited by examiner

SOLAR TRACKING SYSTEM

CROSS-REFERENCE TO RELATED APPLICATIONS

This disclosure is related to co-owned U.S. Pat. No. 7,381,886; patent application Ser. No. 12/024,489 filed on Feb. 1, 2008; and patent application Ser. No. 12/131,556 filed on Jun. 2, 2008. The present application is a continuation of U.S. patent application Ser. No. 12/498,135 filed on Jul. 6, 2009, entitled "Solar Tracking for Terrestrial Solar Arrays with Variable Start and Stop Positions," which is a continuation-in-part of U.S. patent application Ser. No. 12/258,253, entitled "Solar Tracking for Terrestrial Solar Arrays," filed on Oct. 24, 2008 (U.S. Pat. No. 7,795,568), each of which is incorporated herein by reference in its entirety.

TECHNICAL FIELD

This disclosure relates to solar tracking for terrestrial solar cell arrays.

BACKGROUND

This disclosure relates generally to solar tracking for use with one or more terrestrial solar cell arrays that convert sunlight into electrical energy. Accurate solar tracking is necessary because the amount of power generated by a given solar cell is related to the amount of sunlight that impinges on it. In an array, therefore, it is advantageous to optimize the amount of sunlight that impinges on each constituent solar cell. One difficulty, however, arises from the fact that the sun is continuously moving.

SUMMARY

Various aspects of the invention are set forth in the claims.

The details of one or more implementations are set forth in the accompanying drawings and the description below. Various features and advantages will be apparent from the description and drawings, and from the claims.

DETAILED DESCRIPTION

Overview

Figure 1A:
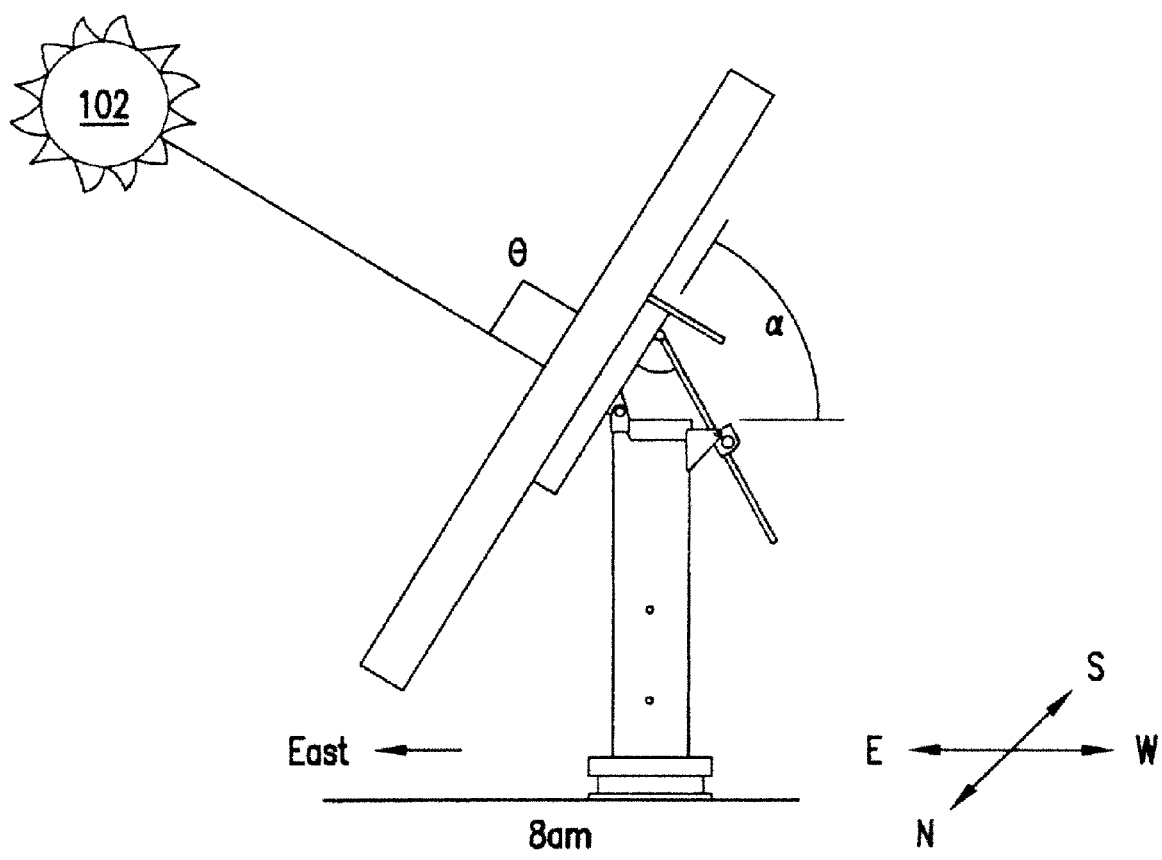
FIG. 1A, 1B, 1C and 1D are an illustration of a solar cell array tracking the sun during different times of the day.
Figure 1B:
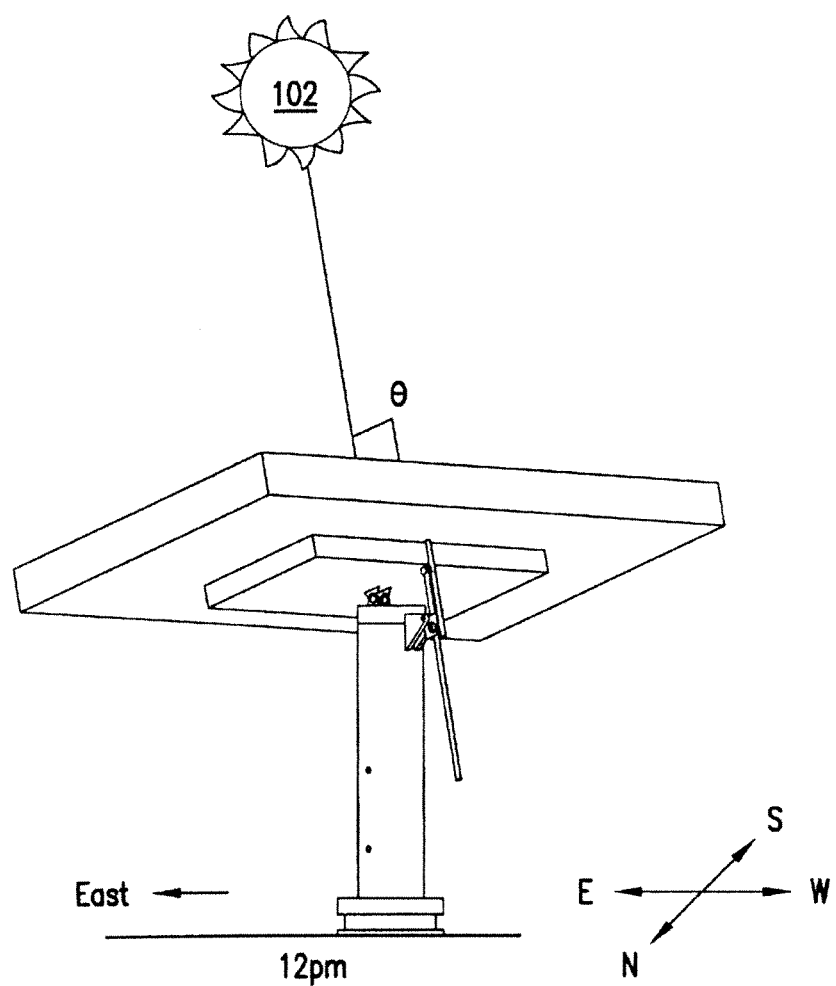
Figure 1C:
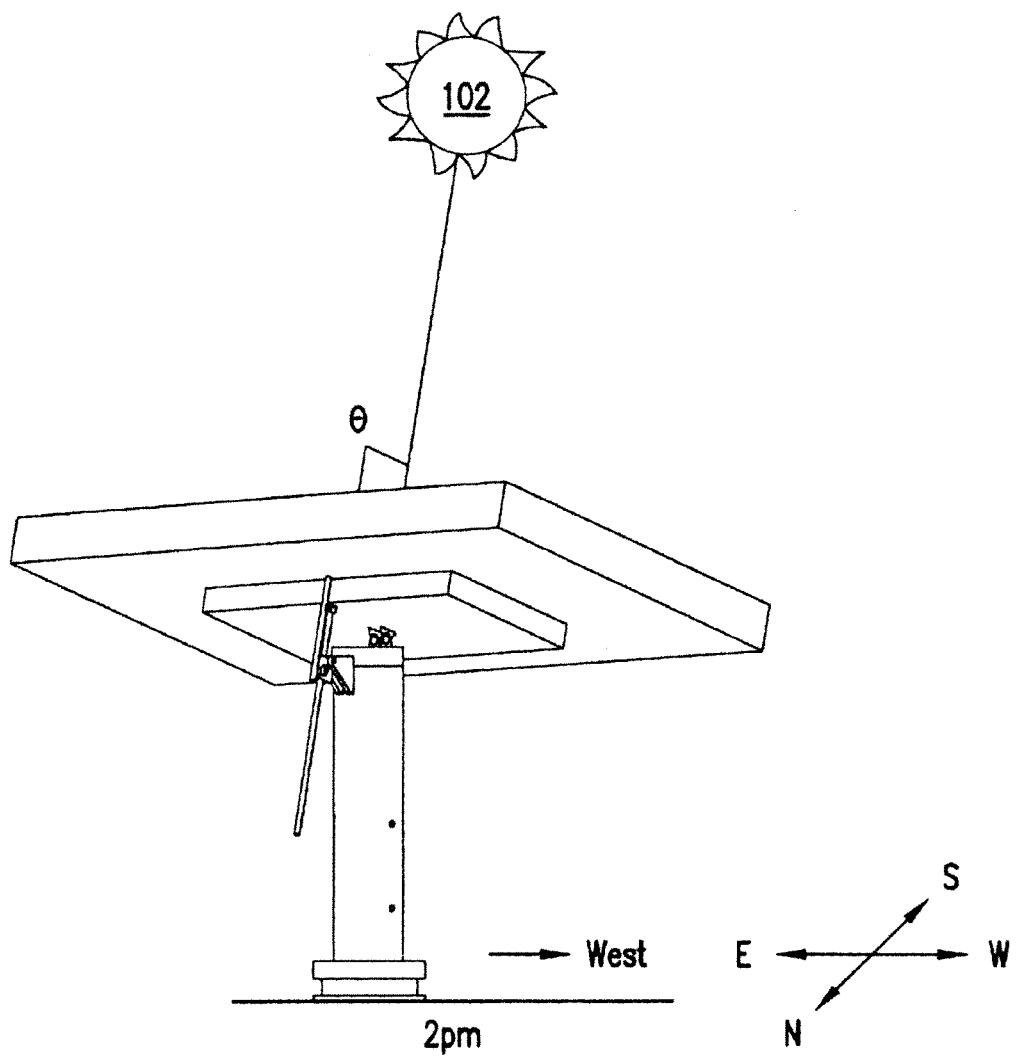
Figure 1D:
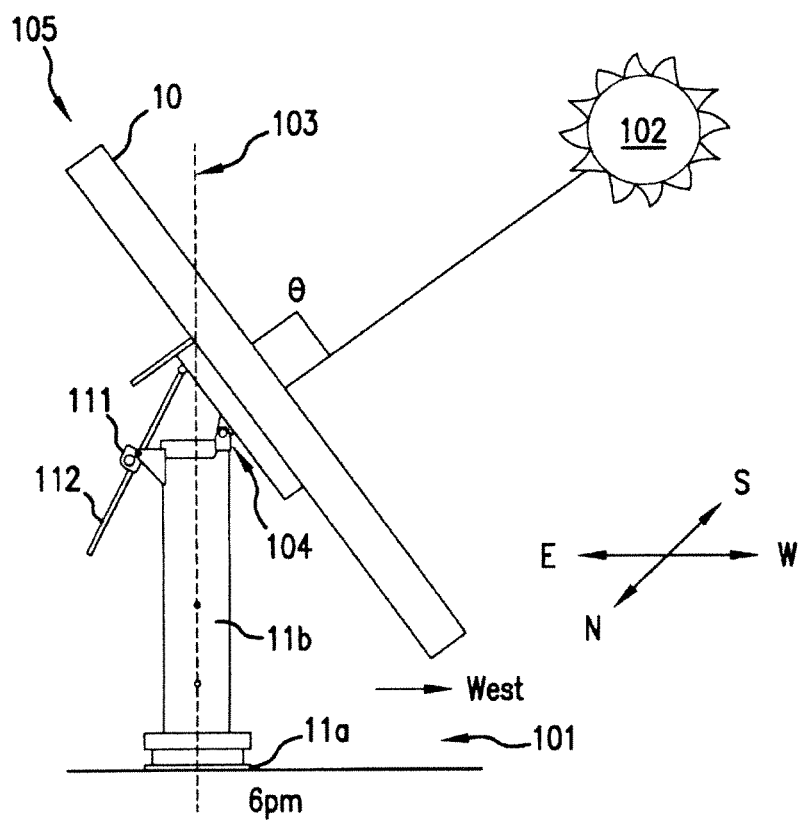

A terrestrial solar power system converts sunlight into electrical energy utilizing, e.g., multiple mounted arrays spaced in a grid over the ground. The array of solar cells has a particular optical size and is mounted for unitary movement on a cross-arm of a vertical support that tracks the sun. The array can include subarrays, sections, modules and/or panels.

The amount of power generated by the array is directly related to the amount of sunlight impinging upon the constituent solar cells. It is highly advantageous, therefore, to orient the array such that the plane of the array (of lenses and solar cells) is orthogonal to the incoming rays of the sun, and the power generation is maximized. To that end, a solar tracking mechanism is employed that ensures that the plane of concentrator lens results in a beam projected on the center of the respective solar cells in a continuous manner as the sun traverses the sky during the day, thereby optimizing the amount of sunlight impinging upon the cells.

As described below, the solar tracking mechanism optimally predicts the location of the sun at a future time, and orients the array such that it aligns with the sun at that future time. Performing this process repeatedly yields the advantageous result that the array remains substantially aligned with the sun's rays. One aspect of this approach is that it involves not only predicting where the sun will be, but predicting how to operate one or more motors (or actuators) to orient the array to meet the sun's rays at that future time. In some implementations, the solar tracking system employs a kinematic model of the array that correlates movement of the one or more motors with the movement of the solar panel.

Solar Tracking

FIG. 1A, 1B, 1C and 1D are an illustration of a solar cell array 105 tracking the sun 102 during different times of the day. The Figures are oriented on the page so that the north direction is out of the page, south is into the page, east is to the left of the page, and west is to the right of the page. The solar cell array 105 includes a central support (11a, 11b) that is fixed to a base 101. The base 101 can be, for example, a concrete foundation on a surface of the earth. The solar cell array 105 also includes a solar panel 10. The solar panel 10 is mounted to the central support (11a, 11b) by way of a jackscrew 111, threaded rod 112 and pivot point (e.g., a hinge) 104. The solar panel includes a generally rectangular array of solar cell receivers (e.g., each receiver including a Fresnel lens and a triple junction III-V compound semiconductor solar cell).

As shown, the panel 10 is kept orthogonal to the rays of the sun 102 as the sun 102 traverses across the sky. This is accomplished by rotating the panel about two substantially perpendicular axes to account for the sun's elevation and azimuth. To adjust for the sun's azimuth, an azimuth motor causes the panel 10 to rotate about axis 103 (i.e., the longitudinal axis of the central support 11a, 11b). To adjust for the sun's elevation, an elevation motor causes the translation of the threaded rod 112 in the jackscrew 111. Because the panel 10 is coupled to the central support (11a, 11b) by a hinge 104, translation of the threaded rod 112 adjusts the angle of the panel 10 (i.e., the panel 10 rotates about the hinge 104). The angle "α" (alpha) shown in FIG. 1A is the "jack angle" which is used by the software in an embodiment of the present invention.

Figure 2:
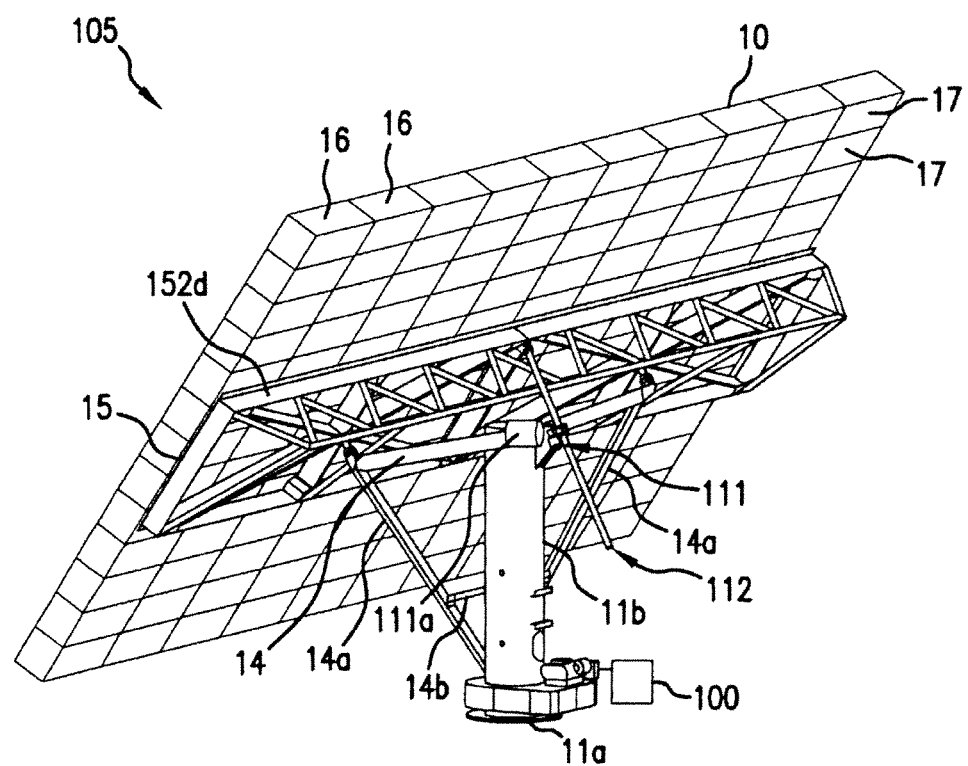
FIG. 2 illustrates further details of an example of a solar cell array.

FIG. 2 illustrates a terrestrial solar cell array 105 in greater detail. The solar cell array of FIG. 2 is described in co-owned U.S. patent application Ser. No. 12/131,556, filed Jun. 2, 2008, hereby incorporated herein by reference. In general terms, the array comprises three major components. The first major component is the central support (11a and 11b). The central support is mounted to a surface (e.g., item 101 of FIG. 1A) and is capable of rotating about its longitudinal axis. Depending on the implementation, the surface can be, e.g., the ground or a concrete foundation formed in the ground. Disposed on or adjacent to the surface is a drive mechanism 100 (e.g., azimuth motor 210 of FIG. 2) that couples to the central support. The drive mechanism 100 enables the inner member 11b to rotate relative to the outer member 11a, e.g., for moving the solar cell array such that it tracks the azimuth of the sun. The drive mechanism can include a motor along with one or more gears.

The second major component is the support frame 15. The support frame 15 couples to the central support and is adapted to support a solar panel (e.g., panel 10). The third major component is the solar panel 10. The solar panel 10 includes multiple subarrays 16 and is coupled to, and supported by, the support frame 15. The solar panel 10 converts sunlight into electricity, and normally is kept facing the sunlight by the rotation of the central support and adjustment of the jackscrew and threaded rod (111 and 112). In this implementation, each of the solar cell subarrays 16 is divided into thirteen sections 17. Each section 17 includes a 2×7 panel of concentrating lenses each lens disposed over a single receiver. The receiver, a printed circuit or subassembly, includes a single III-V compound semiconductor solar cell together with additional circuitry such as a bypass diode (not shown). In some implementations, each section 17 is a module, e.g., a discrete assembly.

In the illustrated implementation, the central support includes an outer member 11a and an inner member 11b. The outer member 11a is connectable to a support mounted on the surface by bolts. The inner member 11b is rotatably mounted within the member 11a and supports a cross member 14 which is connected to a support frame 15. The support frame 15 also is supported on the inner member 11b by a pair of inclined arms 14a which extend respectively from the support frame 15 to the base of the inner member 11b. The inclined arms 14a are coupled to each other by a cross-member 14b that increases their structural integrity. The mounting of the support frame 15 in this manner ensures that it is fixed to the inner member 11b of the central support in such a manner that it is rotatable about its central longitudinal axis through members 11a and 11b.

Jackscrew 111 and mating threaded rod 112 together can adjust the angle of the panel 10 to track the elevation of the sun. Thus, the jackscrew 111 in combination with a drive mechanism 111a (e.g., elevation motor 211 of FIG. 2) enables pivoting the support frame 15 about hinge 104, and thus the panel 10, so as to adjust its angle with respect to the earth's surface.

Figure 3:
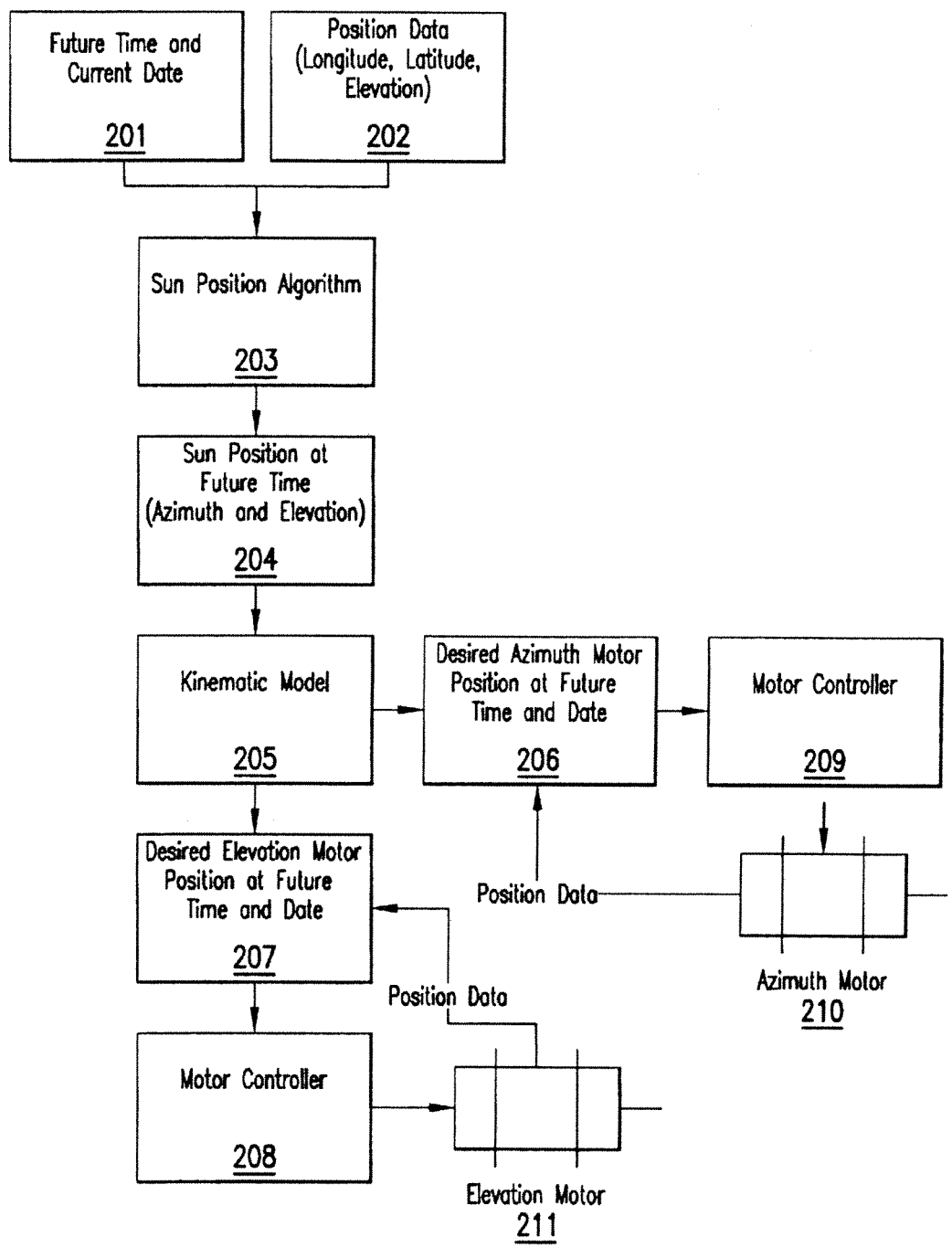
FIG. 3 is a block diagram of an implementation of a terrestrial solar tracking system.

FIG. 3 is a block diagram of an implementation of a terrestrial solar tracking system. The system receives as input data (a) the date and a future time (201) and (b) position data of the array (202), including, e.g., longitude, latitude and elevation above sea level. In this implementation, the system utilizes a future time (201) rather than the current time so that rather than lagging behind the sun, the array can be oriented to align with the sun at its expected position at the future time. In some implementations, the future time (201) is one minute into the future. In some implementations, the future time (201) can be sunrise, so that upon sunrise, the solar panel is aligned with the sun at sunrise. In other implementations, the future time (201) is at some predetermined time after sunrise that serves as a start up time corresponding to when the solar panel will begin tracking the sun. This start up future time is where the solar panel is first oriented toward the sun for tracking during the day time. While a future time associated with actual sunrise may be used, using a start up time after sunrise allows the solar panel to start tracking the sun from a tilted start up position (e.g., the position of the solar panel in FIG. 1A), instead of from a fully (or nearly) vertical position facing the sunrise on the horizon. In some examples, the start up position corresponding to this start up time may be the same as the "parked" (or storage) position of the solar panel during a night mode. For example, a start up position may be a predetermined angular position of 15 degrees, instead of 0 degrees. In any event, to maintain alignment, the system can repeat its alignment calculation periodically (e.g., every minute) or continuously.

Based on at least the input data (201, 202), the sun position algorithm (203) calculates the position of the sun (e.g., its azimuth and elevation) at that future time (204). In some implementations, the sun position algorithm (203) includes the Solar Position Algorithm (SPA) available from the National Renewable Energy Laboratory (see http://rredc.nrel.gov/solar/codesandalgorithms/spa/ and http://www.nrel.gov/docs/fy08osti/34302.pdf, both of which are incorporated herein by reference).

The sun's azimuth and elevation at the future time (204) are input data to a kinematic model (205). The kinematic model (see FIG. 5) correlates movement of the azimuth motor (210) and the elevation motor (211) with movement of the solar panel (10). As such, the kinematic model (205) facilitates calculation of the appropriate actuation of the azimuth motor (206) and the elevation motor (207) so that the array (10) is aligned with the sun's elevation and azimuth at the future time (204). Each of the motors (210, 211) includes a position encoder that determines the current position of each respective motor (e.g., measured by the rotational position of the drive shaft, represented as an integral number of "counts" or increments of a predetermined numbers of degrees, starting from zero and continuing through 360 degrees for one turn, 720 degrees for two turns, etc.). For control purposes, the position data is fed back to the motor position calculation (206, 207). The position encoder may determine position based on a baseline position corresponding to a start up position of the solar panel. As described, this start up position for solar tracking may be one in which the solar panel starts tracking the sun at sunrise. However, in other implementations, this start up position corresponds to a position at a future time after sunrise, at which the solar panel is to start tracking the sun.

Motor controllers (208, 209) allow the low-power logic signals based on the algorithms to control the relatively high-power circuits of the motors (210, 211). With respect to FIG. 2 and FIG. 3, the azimuth motor 210 would be arranged to cause rotation of the panel 10 about axis 103. The elevation motor 211 would be coupled to the jackscrew 111 and threaded rod 112 so as to adjust the angle of the panel 10 (i.e., rotate the panel 10 about the hinge 104). Examples of azimuth and elevation motors are illustrated in FIG. 2 (items 100 and 111a, respectively).

The data of blocks 201-207 can be stored in one or more data stores (e.g., magnetic media, solid state media, or other suitable memory structures). The processing of, e.g., blocks 203 and 205-209 can be performed by, e.g., one or more microprocessors or special or general purpose computers.

Figure 4:
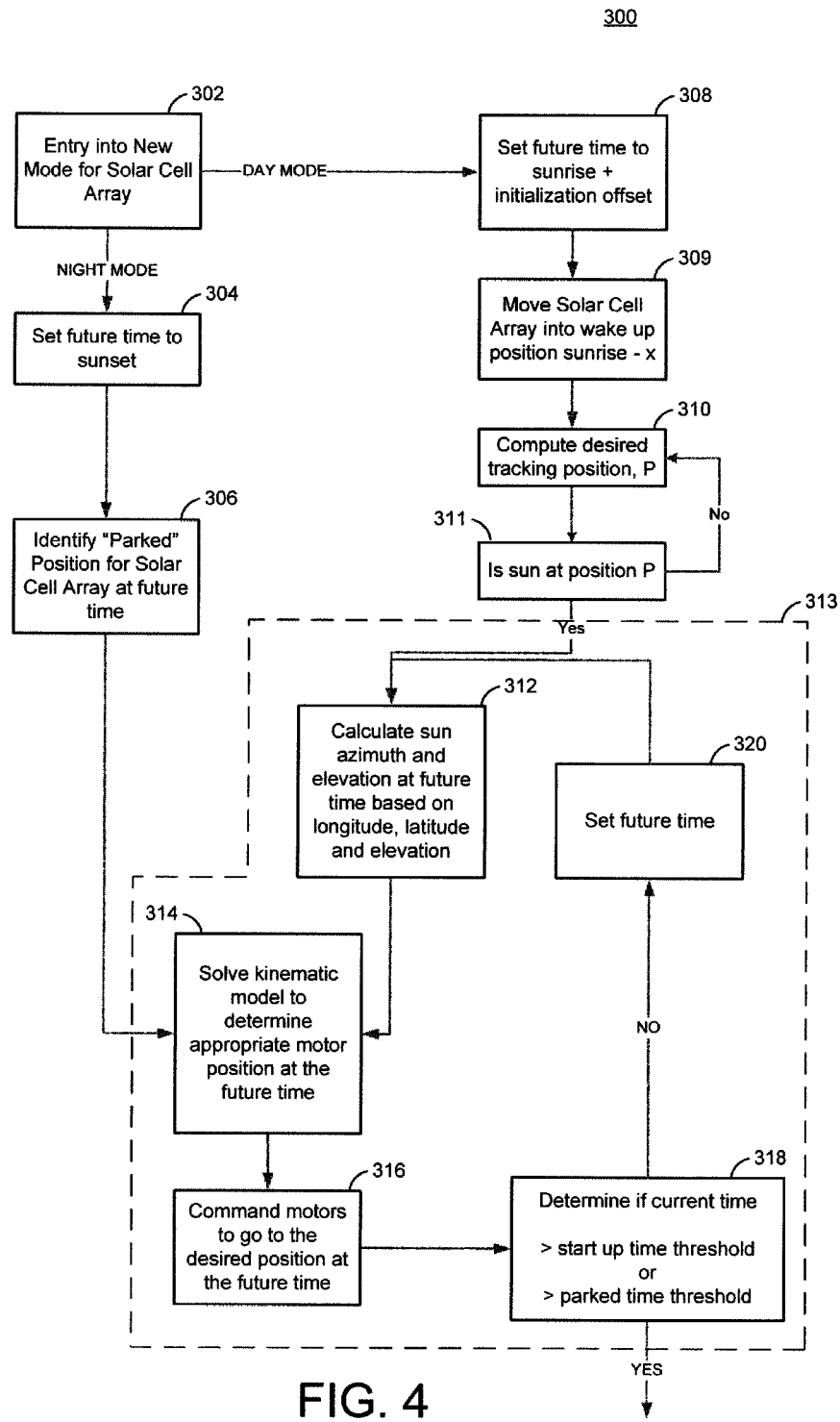
FIG. 4 is a flow chart of terrestrial solar tracking.

FIG. 4 illustrates an implementation 300 of a method for terrestrial solar tracking. First, a block 302 determines whether the solar cell array is entering into a one of either a Night mode, where the solar cell array is not activated to collect solar energy, or a Day mode, where the solar cell array is to track the sun and absorb solar energy. Generally speaking, "night mode" refers to a time frame over which the solar panel is no longer tracking the sun, but rather has been placed in a "parked" position, intermediate position, or otherwise to maintain the solar panel until a Day mode is reached. As explained further below, the "night mode" may start before or after sunset, but generally coincides with the night time. The "day mode" refers to a time frame over which the solar panel is tracking the sun or is put into a ready, or intermediate position, to begin tracking the sun. The "day mode" may start before or after sunrise—preferably it starts at a predetermined time before—but generally coincides with the time from sunrise to sunset when the sun is positioned in the sky and available for tracking, irrespective of obstacles and weather conditions affecting such tracking.

In the illustrated example, the block 302 determines when the mode is changing from the Day mode to the Night mode or from the Night mode to the Day mode, for example by storing a current mode and comparing that to an identified future mode from a block 304, which is discussed further below. If the block 302 determines that the solar cell is moving from Day mode to Night mode, then a block 304 sets a future time to a time for entering the solar cell array into a "parked" position. For example, the block 304 may set the future time to sunset or some offset time before or after sunset at which point the solar cell array is to be placed in the "parked" position. In the illustrated example, the block 304 specifically sets the future time to sunset.

A block 306 identifies the "parked" position corresponding to that future time, where the "parked" position is the position that the solar cell array will be kept in during the Night mode. For example, in some implementations, the Night mode orients the solar panel 10 into a "parked" position that minimizes damage from weather or other hazards. Thus, the "parked" position may be one pointing away from the night sky or sun. Alternatively, identifying the parked position as being one to store the solar panel 10 for non-operation, the block 306 may determine that the appropriate "parked" position is one in which the solar panel 10 is made to point in the expected direction of the next sunrise or the sun some time thereafter. In these and other embodiments, the parked position may be one in which the solar panel 10 is maintained at an angled position that is neither fully vertical nor fully horizontal. By maintaining the solar panel 10 at an angled, predetermined position, when the system 300 enters the Day mode, the solar panel can quickly move to a "start up" position for tracking the sun, or to an intermediate "wake up" position where it is held prior to start up. In any event, once the future time for parking the solar panel 10 has been identified by block 304, the system 300 is then able to identify either a position for dormancy during the Night mode, the next position at which the sun will be tracked during the Day mode, or some other position predetermined for storage of the solar panel 10. The examples are not limited to a particular type of "parked" position that corresponds to the identified future time from block (304). In fact, the block 306 may set different "parked" positions based on the future time identified at block 304.

Returning to the block 302, if it is determined that the solar panel 10 is entering a Day mode from a Night mode, a block 308 sets the future time to some start up time that is sunrise plus some initialization offset time. The block 308 is described as operating in a Day mode, yet, this mode may be executed at any point after the solar panel 10 has been parked for the Night mode. The block 308 will typically determine the future time to sunrise and the initialization offset during the night. The sunrise may be a projected sunrise based on calculated or provided data. The initialization offset time for example may be some predetermined time after sunrise that serves as a start up time at which the solar panel will begin tracking the sun.

At start up from the block 308, the future time may be sunrise plus 10 minutes, 20 minutes, or 40 minutes, for example. The particular future time for start up identified by the block 308 may be predetermined or it may be based on a desired sun azimuth and elevation, other than sunrise, at which the solar panel is to start tracking. For example, if the elevation of the sun is less than an elevation minimum for solar tracking, then the system may be designed to wait until the future time when the sun is at the desired azimuth and/or elevation. Using a start up time after sunrise allows the solar panel 10 to start tracking the position of the sun from an angled, start up position as determined by the block 309 instead of from an initial vertical position. Any other future time values (320) may be measured as an amount of time that has or will have elapsed from the start up time (308).

With the future startup time set to some time after sunrise by block 308, a block 309 wakes up the solar panel 10, preferably at some time, x (minutes), before sunrise. This time corresponds to a time where the actuators, motors, etc. of the solar panel are powered up from a dormant (power save) state to a powered state. The value of x is arbitrary and may be set to a few minutes, for example 3 mins, 0 minutes (i.e. sunrise) or otherwise. The block 309 may calculate or already have stored an identified "wake up" position for the solar panel 10, where the block 309 commands the motors of the solar panel 10 to position the solar panel into a "wake up" position. This typically means decreasing or increasing elevation compared to that of the "parked" position of the Night mode. The time x is set such that the block 309 has sufficient time to move the solar panel 10 into the "wake up" position prior to solar tracking. The "wake up" position may be the "start up" at which point the solar panel is to begin solar tracking. However, preferably the "wake up" position is an intermediate position, shy of the "start up" position, but sufficiently close to the "start up" position to make movement into that position occur considerably faster than would occur if moving directly from the "parked" position to the "start up" position.

While this "wake up" position is optional, it may provide some advantages. With such an intermediate position, the solar panel may be moved into the same pre-start up position every day irrespective of the seasonal position of the sun, weather conditions, etc. An intermediate position may be chosen, for example, where the solar panel will be held at 3 degrees (elevation) above the highest calculated initial elevation (start up elevation) for solar tracking at any point during the year, i.e., 3 degrees above the highest computed elevation value for P for the year. Using a "wake up" position, immediately prior to solar tracking, the solar panel may be positioned within approximately 3 to 10 degrees elevation above the elevation needed for actual "start up" and solar tracking. The solar panel will have a shorter travel distance to get into the "start up" position for tracking, which will eliminate some of the errors and tracking delay that can occur during a solar tracking start up otherwise.

A block 310 computes a desired position, P, of the sun at which tracking by the solar panel is to occur, i.e., corresponding to the "start up" time from the block 308. This calculation may be of the sun's azimuth and elevation positions at the time identified by the block 308, namely the projected sunrise time plus some initialization offset. As the sun rises and moves, blocks 311 and 310 form a control loop that determines when the sun is at the desired position, P, to start solar tracking. Once the desired position is reached, the sun is tracked by a tracking process illustrated in the example of FIG. 4 as block 313.

The block 310 may identify the "start up" position based on the start-up time from block 308. The block 310, for example, may set a start up position of 5 degrees above the horizon, for example. The exact position of the start up position may depend on the particulars of the neighboring geographic terrain, nearby man made obstructions, or for any other reason related to optimizing solar panel usage. If mountains are on the horizon, for example, the angle for this start up position may even be greater than 5 degrees. In any event, in the preferred embodiment, at some time after sunrise the tracking process may be initiated, and correspondingly the solar panel may be positioned at a start up position that begins tracking at that time after sunrise. While the blocks 308, 309, 310 and 311 are shown separately, these blocks may be combined together into the same algorithm.

Based on the start-up position, the sun's azimuth and elevation at the future time are calculated using the sun position algorithm (312). Generally, speaking the algorithm (312) will calculate the azimuth and elevation at any future time, not just the start up time. The future time can vary with the implementation, but in some implementations, the future time is one minute into the future, five minutes into the future, or some greater or less amount of time into the future.

For a Day mode, using the sun's elevation and the azimuth, the kinematic model is used to determine the appropriate position of the azimuth and elevation motors (e.g., the rotational position of the drive shafts) to orient the solar cell array such that it is aligned with the sun at the future time (314). That is, in a Day mode, the kinematic model (314) starts by determining the appropriate motor positions for the start-up position identified in the block 309 and using the data from the block 312. After this initialization start-up, the kinematic model (314) determines the appropriate positions for any future time, as part of the normal solar tracking procedure. In any event, with the data from the kinematic model (314), the elevation and azimuth motors are then commanded to the appropriate positions at the future time (316). In some implementations, block 316 includes precisely controlling the speed of the motors such that, at the future time, the solar panel is aligned with the sun's position at the future time. In some implementations, the motors are operated so that the solar cell array smoothly translates to the appropriate position.

For a Night mode, the kinematic model is used to determine the appropriate position of the azimuth and elevation motors to orient the solar cell array to the "parked" position identified by the block 306, and the elevation and azimuth motors are then commanded to the appropriate positions by the block 316.

After or during motor movement, a block 318 tracks the current time to determine if the current time is in a region at which a change in mode has occurred. For example, the block 318 determines if the current time is greater than a start-up time threshold, such as after sunrise, sunrise+initialization offset time, or sunrise−some initial machine ramp up time. Or the block 318 may determine if the current time is greater than a parked time threshold, such as after sunset, sunset 30 some time, or sunset−some time. If the current time is in one of these mode changing regions control is passed to the block 302, as a mode change as been confirmed. Otherwise, control is passed to block 320 which determines the next future time for Day mode solar tracking, and then instructs the block 312 to calculate the sun azimuth and elevation at the new future time.

Figure 5:
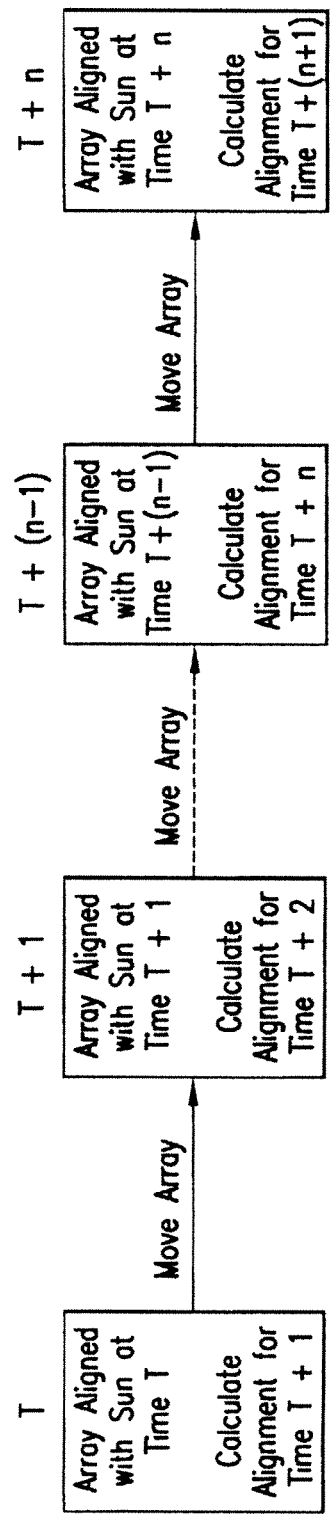
FIG. 5 is a block diagram illustrating solar tracking as a function of time.

FIG. 5 illustrates an example of solar tracking as a function of time. As described, the solar tracking system predicts the position of the sun at a future time (e.g., one minute into the future) and begins moving the solar cell array so that when the future time arrives, the solar cell array is aligned with the sun's future position. The calculating and moving can be done continuously (e.g., such that the sun's future position is continuously being calculated and the solar cell array is continuously moving) or can be done periodically or intermittently (e.g., every minute, the sun's future position is calculated and the solar cell array is moved).

Thus, at time T, the solar cell array is aligned with the sun's position at time T. At the same time, the position of the sun at a future time T+1, (e.g., one minute into the future) is calculated, as well as the manner of actuating the azimuth and elevation motors based on the kinematic model so that the solar cell array aligns with the sun's position at time T+1. Between T and T+1, the solar cell array is moved such that at time T+1, the solar cell array is aligned with the sun's position at time T+1. Likewise, at time T+1, the position of the sun at a future time T+2 is calculated, as well as the manner of actuating the azimuth and elevation motors based on the kinematic model so that the solar cell array aligns with the sun's position at time T+2. The process continues such that at T+n (i.e., an arbitrary time in the future), the solar cell array is aligned with the sun at its position at time T+n, and the position of the sun at a future time T+(n+1) is calculated, as well as the manner of actuating the azimuth and elevation motors based on the kinematic model so that the solar cell array aligns with the sun's position at time T+(n+1).

Figure 6:
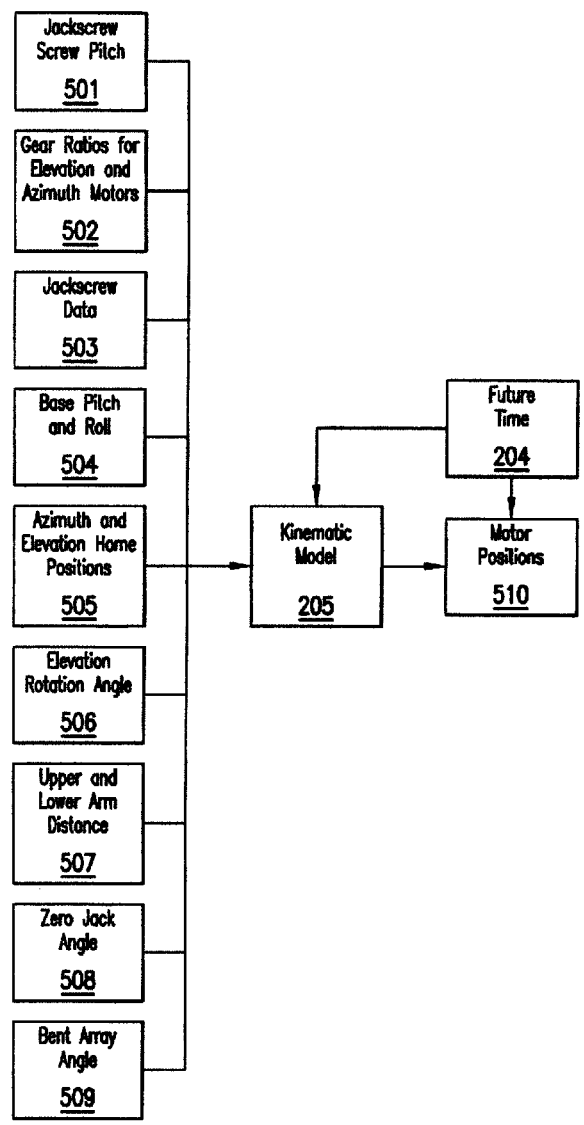
FIG. 6 is a block diagram of an implementation of a kinematic model for a terrestrial solar cell array.

FIG. 6 illustrates an implementation of the kinematic model 205. As discussed, the kinematic model 205 correlates movement of the azimuth and elevation motors with the movement of the solar panel. Therefore, if the desired position of the solar panel is known (e.g., vis-à-vis the position of the sun at a given time), the kinematic model 205 can derive how the motors should be actuated to move the solar cell array to the desired position (e.g., move the azimuth motor driveshaft 0.5 degrees and move the elevation motor driveshaft 2 degrees).

To perform the correlation function, the kinematic model 205 receives several parameters as input data. Some examples are shown in FIG. 6 as blocks 501-509. Generally speaking, while more parameters can provide a more accurate kinematic model, all of blocks 501-509 are not required to achieve a functional kinematic model. In fact, since the kinematic model 205 can be tailored for a particular array, entirely different parameters can be used in some implementations. For example, this example presumes that the solar cell array uses geared elevation and axis motors and a jackscrew. Some solar cell arrays can use direct drive and another means for adjusting the angle of the array. Therefore, the parameters are advantageously chosen based on the configuration of the particular array.

Some parameters are directed to the particular mechanical characteristics of the solar cell array. The kinematic model 205, in this implementation, receives the pitch of the threaded rod (e.g., item 112 of FIG. 2). This parameter 501 is informative to the model 205 because depending on the thread pitch, more or less rotation will be required to accomplish a given linear translation (e.g., a finer thread pitch requires more rotation to accomplish the same linear translation than a coarser thread pitch). The gear ratios (502) are informative for the same reason—they are related to how much the motor driveshafts must rotate to accomplish a given amount of translation of the solar panel. The jackscrew data (503) includes information about the jackscrew, such as length and position of the rod, and the angle between the solar panel and the threaded rod. This parameter 503 affects how much of the linear translation of the threaded rod (112) is translated into adjusting the angle of the solar panel. For example, if the angle between the solar panel and the threaded rod is about ninety degrees, substantially all of the linear motion of the threaded rod is translated into adjusting the tilt of the solar panel. Moreover, since the angle of the threaded rod can change as it translates, a trigonometric model can be used to continuously update this parameter (i.e., 503 can be a dynamic parameter). Azimuth and elevation motor home positions (505) are the positions that the controllers for azimuth and elevation motors, respectively, regard as their home positions. The elevation home position can also be specified by the length of the threaded rod when the elevation motor is in its home position. Although such data may optionally also be included in the 503 data, the upper and lower arm distance parameter (507) is herein called out separately and relates to the distance between the top of the threaded rod (e.g., 112) of the jackscrew (e.g., 111) and the elevation hinge about which the solar panel rotates (e.g., hinge 104) and the distance between the bottom of the threaded rod and the elevation hinge. This parameter 507 duplicates or is related to the jackscrew data parameters (503) in the sense that it also pertains to the geometry of the elevation adjustment and how translation of the threaded rod translates into changing the elevation angle. The zero jack angle parameter (508) is the elevation angle of the solar panel when the jackscrew angle is zero. The foregoing parameters can also affect the speed at which the motors are operated. For example, a finer thread pitch for the jackscrew (parameter 501) means that the elevation motor must rotate faster to accomplish a given change in elevation in a given time period as compared to a coarser thread pitch. As another example, a similar concept applies to the motor gear ratios (parameter 502).

Some parameters are directed to compensating for imperfections in the solar cell array installation and construction. For example, parameter 504 is directed to the base (e.g., item 101 of FIG. 1A) pitch and roll. The base might not be perfectly level, and therefore, as the solar panel translates in one direction, an errant translation also can occur in a second direction. Parameter 504 allows the kinematic model 205 to account for such errors. Also, in theory, the elevation axis (e.g., about hinge 104) is perpendicular to the azimuth axis (e.g., axis 103). However, variances in construction and/or assembly may result in the elevation and azimuth axes being non-perpendicular. Parameter 506 allows the model 205 to account for such an error. Also, in theory, the plane of the solar panel is perpendicular to the elevation hinge (e.g., hinge 104). Variances in construction and/or assembly may result in that not being the case. Parameter 509 allows the model 205 to account for such an error.

The kinematic model 205 receives parameters 501-509 and the sun's position at the future time (204). With that input data, the kinematic model 205 determines how the motors should be actuated (510) to align the solar panel with the sun at the future time. The future time (204) data is further utilized to specify the motor positions (510).

The data of blocks 501-509 can be stored in one or more data stores (e.g., magnetic media, solid state media, or other suitable memory structure). The processing of, e.g., blocks 503 and 205 can be performed by, e.g., one or more microprocessors or special or general purpose computers.

Figure 7:
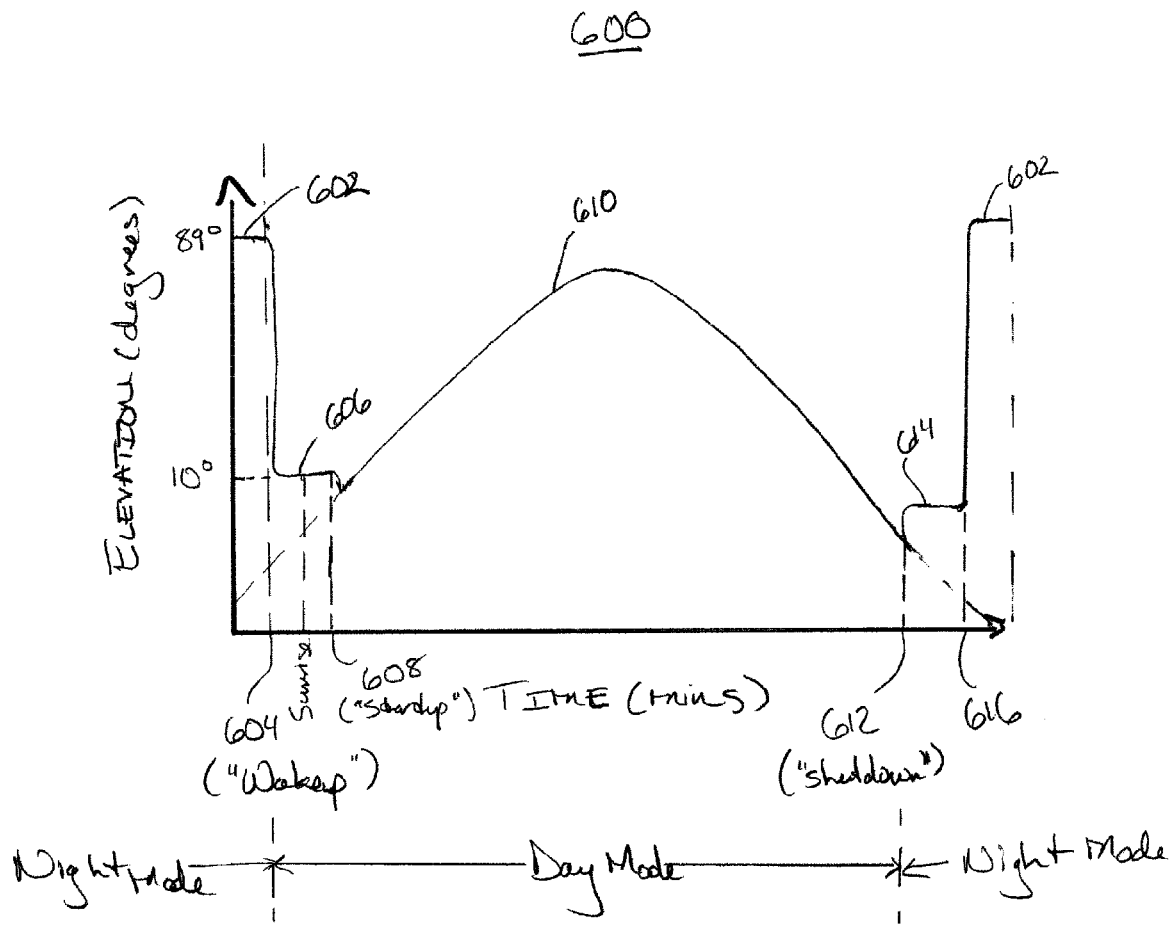
FIG. 7 is a plot of elevation versus time for a solar cell array in accordance with an example implementation.

FIG. 7 illustrates a timing diagram 600 for an example implementation of the solar tracking techniques described herein. At the leftmost side of the diagram, the solar panel is in a "parked" position 602 that was initiated from the Night mode occurring at the rightmost side of the diagram. In this example, the solar panel is stored at 89 degrees during the morning until a "wake up" time 604, sunrise−x mins occurs. At "wake up," the solar panel powers fully up and the motors are controlled to move the solar panel to a "wake up" position 606, which in the illustrated example corresponds to about 10 degrees elevation (e.g., as identified by block 309). The exact "wake up" position may of course be different, as is the case with the other stored positions described herein. The solar panel is held at this position until a start up time 608 has occurred, corresponding to the sunrise time plus initialization offset from block 308, at which point the solar panel moves from the "wake up" position to the determined "start up" position, from which solar tracking occurs (region 610). The elevation of the solar panel changes until dusk.

In the illustrated example, as the solar panel tracks the sun, the solar panel eventually approaches another intermediate time 612 corresponding to a "shut down" position 614 where the solar panel is increased to a "shut down" elevation, which is below about 10 degrees in the illustrated example. The solar panel is maintained at this "shut down" position, until a "parked" position has been identified and the solar panel is moved into that "parked" position for storage in the Night mode. Merely by way of example, in this example the Day mode extends from the "wake up" time 604 to the "shut down" time 612. In other examples, the Day mode may start or stop on other time events illustrated in FIG. 7, such as between "start up" time 608 and a night storage time 616.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment or a combination of one or more of them. A propagated signal is an artificially generated signal, e.g., a machine-generated electrical, optical, or electromagnetic signal, that is generated to encode information for transmission to a suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output.

The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

A number of implementations have been described. Nevertheless, it will be understood that various modifications may be made without departing from the spirit and scope of the invention. Accordingly, other embodiments are within the scope of the claims.

What is claimed is:

1. A solar cell system above a ground surface comprising:
   a solar panel assembly comprising at least one solar panel;
   at least one drive assembly coupled to the at least one solar panel and configured to move the at least one solar panel about a first axis substantially perpendicular to the ground surface and a second axis substantially parallel to the ground surface;
   a controller operably coupled to the at least one drive assembly to align the at least one solar panel with the sun, wherein the controller is configured to:
   predict a position of the sun based on at least a time, a day, a latitude of the at least one solar panel, and a longitude of the at least one solar panel, and
   determine actuations for the at least one motor drive to align the at least one solar panel with the sun based on the predicted position of the sun and at least one correlation parameter, wherein the at least one correlation parameter comprises at least one mechanical or construction characteristic of the system.

2. The solar cell system of claim 1, wherein the at least one drive assembly comprises a jackscrew coupled to the at least one solar panel and configured to move the at least one solar panel about the second axis to adjust an inclination angle of the at least one solar panel relative to the ground surface, wherein the jackscrew comprises a threaded rod defining a thread pitch, wherein the at least one mechanical or construction characteristic comprises the thread pitch of the jackscrew of the at least one drive assembly.

3. The solar cell system of claim 1, wherein the at least one drive assembly comprises at least one gear defining a gear ratio between another gear or a jackscrew, wherein the at least one mechanical or construction characteristic comprises the gear ratio of the at least one drive assembly.

4. The solar cell system of claim 1, wherein the at least one drive assembly comprises a jackscrew coupled to the at least one solar panel and configured to move the at least one solar panel about the second axis to adjust an inclination angle of the at least one solar panel relative to the ground surface, wherein the jackscrew defines a length, a position, and a jack angle between the at least one solar panel and the jackscrew, wherein the at least one mechanical or construction characteristic comprises at least one of the length, the position, and the jack angle between the at least one solar panel and the jackscrew of the at least one drive assembly.

5. The solar cell system of claim 1, wherein the at least one mechanical or construction characteristic comprises a base pitch and roll configured to compensate for the first axis being non-perpendicular to the ground surface.

6. The solar cell system of claim 1, wherein the at least one drive assembly comprises an azimuth motor drive configured to move the at least one solar panel about the first axis and an elevation motor drive configured to move the at least one panel about the second axis, wherein the at least one mechanical or construction characteristic comprises at least one of an azimuth home position for the azimuth motor drive and an elevation home position for the elevation motor drive.

7. The solar cell system of claim 1, wherein the at least one mechanical or construction characteristic comprises an elevation rotation angle configured to compensate for the second axis being non-parallel to the ground surface.

8. The solar cell system of claim 1 wherein the at least one drive assembly comprises a jackscrew extending from a bottom end portion to a top end portion and configured to move the at least one solar panel about the second axis to adjust an inclination angle of the at least one solar panel relative to the ground surface, wherein the top end portion of the jackscrew is coupled to the at least one solar panel, wherein the solar panel assembly comprises a central support pivotably coupled to the at least one solar panel and configured to support the at least one solar panel above the ground surface,
   wherein the at least one mechanical or construction characteristic comprises an upper and lower arm distance parameter configured to compensate for a distance between the top end portion of the jackscrew and the pivotably coupled central support and a distance between the bottom end portion of the jackscrew and the pivotably coupled central support.

9. The solar cell system of claim 1, wherein the at least one mechanical or construction characteristic comprises a zero jack angle parameter configured to compensate for the at least one solar panel being non-parallel to the ground surface when the at least one drive assembly coupled to the at least one solar panel cannot move the at least one solar panel about the second axis any further in either direction.

10. The solar cell system of claim 1, wherein the solar array assembly comprises a central support configured to support the at least one solar panel above the ground surface and a hinge member pivotably coupling the at least one solar panel to the central support about the second axis, wherein the at least one mechanical or construction characteristic comprises a bent array angle configured to compensate for the at least one solar panel being non-perpendicular to the hinge member.

11. The solar cell system of claim 1, wherein the at least one drive assembly comprises:

an elevation motor drive configured to move the at least one panel about he second axis to adjust an inclination angle of the at least one solar panel relative to the ground surface; and a jackscrew coupled to the elevation motor drive and to the at least one solar panel, wherein the jackscrew comprises a threaded rod defining a thread pitch, wherein the at least one mechanical or construction characteristic comprises a selected speed for the elevation motor drive based, at least in part, on the thread pitch.

12. An automated method of causing a photovoltaic solar cell array of a terrestrial solar cell system to track the sun, the system comprising first and second motors each of which is operable to adjust a position of the array along a different respective axis with respect to the sun, wherein the first motor is coupled to a jackscrew that adjusts the inclination angle of the array relative to the surface of the earth and the second motor is coupled to a drive assembly that rotates the array about an axis substantially perpendicular to the surface of the earth, the method comprising:

(a) using a software algorithm to predict a position of the sun at a future time, the predicting based at least in part, on latitude, longitude and elevation, wherein the future time is a predetermined start up time after sunrise when the solar cell array is to begin tracking the sun;

(b) using a computer model to determine respective actuations for the motors corresponding to the solar cell array being substantially aligned with the sun at the future time, the determining based on at least one property of each of the jackscrew and the drive assembly; and (c) operating the motors at respective particular speeds so that at the future time the solar cell array is substantially aligned with the sun.

13. The method of claim 12, wherein the jackscrew comprises a threaded rod having a particular thread pitch, wherein the determining is based, at least in part, on the thread pitch or based, at least in part, on an angle at which the jackscrew is coupled to the solar array.

14. The method of claim 12 wherein the drive assembly comprises at least one gear having a gear ratio between another gear or a jackscrew, wherein the determining is based, at least in part, on the gear ratio.

15. The method of claim 12 wherein the jackscrew comprises a threaded rod having a particular thread pitch, wherein the particular speed of the first motor is based, at least in part, on the thread pitch.

16. The method of claim 12, wherein the particular speed of the first motor is based, at least in part, on an angle at which the jackscrew is coupled to the solar array.

17. The method of claim 12, wherein the drive assembly comprises at least one gear having a gear ratio between another gear or a jackscrew, wherein the particular speed of the second motor is based, at least in part, on the gear ratio.

18. The method of claim 12, comprising continuously repeating steps (a), (b) and (c) for additional future times after the predetermined start up time.

19. The method of claim 12 comprising repeating steps (a), (b) and (c) after a predetermined time period and for additional future times after the predetermined start up time.

\* \* \* \* \*

UNITED STATES PATENT AND TRADEMARK OFFICE
CERTIFICATE OF CORRECTION

PATENT NO.        : 8,946,608 B2                                Page 1 of 1
APPLICATION NO.   : 13/970235
DATED             : February 3, 2015
INVENTOR(S)       : James Sherman It is certified that error appears in the above-identified patent and that said Letters Patent is hereby corrected as shown below:

Claims

In claim 11, column 13, line 2, please delete "he" and insert --the--.

Signed and Sealed this
Twenty-fifth Day of August, 2015

Michelle K. Lee
*Director of the United States Patent and Trademark Office*